US010371761B2

(12) United States Patent
Tondra et al.

(10) Patent No.: US 10,371,761 B2
(45) Date of Patent: Aug. 6, 2019

(54) LOW PROFILE MAGNETORESISTIVE IMAGING SENSOR ARRAY

(71) Applicant: MultiDimension Technology Co., Ltd., Zhangjiagang (CN)

(72) Inventors: Mark C. Tondra, Zhangjiagang (CN); Songsheng Xue, Zhangjiagang (CN); James Geza Deak, Zhangjiagang (CN); Insik Jin, Zhangjiagang (CN); Weifeng Shen, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 487 days.

(21) Appl. No.: 15/109,213

(22) PCT Filed: Dec. 29, 2014

(86) PCT No.: PCT/CN2014/095246
§ 371 (c)(1),
(2) Date: Aug. 22, 2016

(87) PCT Pub. No.: WO2015/101244
PCT Pub. Date: Jul. 9, 2015

(65) Prior Publication Data
US 2017/0003357 A1    Jan. 5, 2017

(30) Foreign Application Priority Data

Dec. 31, 2013 (CN) .......................... 2013 1 0750924

(51) Int. Cl.
*G01R 31/02*    (2006.01)
*G01R 33/09*    (2006.01)
(Continued)

(52) U.S. Cl.
CPC ......... *G01R 33/091* (2013.01); *G01R 33/072* (2013.01); *G01R 33/09* (2013.01); *G06K 9/186* (2013.01); *G06K 9/209* (2013.01)

(58) Field of Classification Search
USPC ............... 324/207.11, 205.15, 207.2, 207.21
See application file for complete search history.

(56) References Cited

U.S. PATENT DOCUMENTS

| 7,145,330 B2 * | 12/2006 | Xiao | G01Q 10/04 |
| | | | 324/244 |
| 7,747,817 B2 * | 6/2010 | Norman | G06F 3/061 |
| | | | 365/185.1 |

(Continued)

FOREIGN PATENT DOCUMENTS

| CN | 101218678 | 7/2008 |
| CN | 102968845 A | 3/2013 |

(Continued)

OTHER PUBLICATIONS

"International Application No. PCT/CN2014/095246, International Search Report and Written Opinion dated Mar. 25, 2015", (dated Mar. 25, 2015), 10 pgs.

(Continued)

*Primary Examiner* — Vincent Q Nguyen
(74) *Attorney, Agent, or Firm* — Schwegman Lundberg & Woessner, P.A.

(57) ABSTRACT

A low profile magnetoresistive imaging sensor array based on the principle of magnetic induction, which reduces a distance between a medium imaging sensor array and a medium by optimizing the arrangement of an application integrated circuit and a sensing element array and using an electric connection technology which can reduce the distance between the medium imaging sensor array and the medium, thereby increasing the resolution of the existing medium imaging sensor. The low profile magnetoresistive (Continued)

imaging sensor array includes a sensing element array and an application integrated circuit, and also includes a circuit which provides a power for the sensing element array, a magnetoresistive sensing element array selection circuit, a signal amplification circuit, a digitizer, a memory circuit, and a microprocessor. Additionally, the sensing element array includes at least one magnetoresistive sensing element.

15 Claims, 10 Drawing Sheets

(51) Int. Cl.
  *G01R 33/07* (2006.01)
  *G06K 9/18* (2006.01)
  *G06K 9/20* (2006.01)

(56) References Cited

U.S. PATENT DOCUMENTS

| | | |
|---|---|---|
| 7,804,165 B2 | 9/2010 | Boeve et al. |
| 2003/0173958 A1 | 9/2003 | Goldfine et al. |
| 2009/0045810 A1 | 2/2009 | Sugihara et al. |
| 2010/0156634 A1* | 6/2010 | Massengill .......... G01R 33/072 340/540 |
| 2011/0297745 A1 | 12/2011 | Isuyama |

FOREIGN PATENT DOCUMENTS

| | | |
|---|---|---|
| CN | 203038357 U | 7/2013 |
| CN | 103336251 | 10/2013 |
| CN | 203275621 U | 11/2013 |
| CN | 203350427 | 12/2013 |
| CN | 103744038 | 4/2014 |
| CN | 203759230 | 8/2014 |
| JP | 2006266862 A | 10/2006 |
| JP | 2008073522 | 4/2008 |
| JP | 2009003678 A | 1/2009 |
| JP | 2010192060 A | 9/2010 |
| WO | WO-2008093699 A1 | 8/2008 |
| WO | WO-2015101244 | 7/2015 |

OTHER PUBLICATIONS

"Chinese Application No. 201310750924.9, First Office Action dated Nov. 2, 2015", (dated Nov. 2, 2015), 2 9pgs. X.
"Chinese Application No. 201310750924.9, Second Office Action dated Jun. 6, 2016", (dated Jun. 6, 2016), 31 pgs.
"Chinese Application No. 201310750924.9, Third Office Action dated Nov. 14, 2016", (dated Nov. 14, 2016), 32 pgs.
"European Application No. 14876525.8, Extended European Search Report dated Aug. 7, 2017", (dated Aug. 7, 2017), 14 pgs.
"Japanese Application No. JP2016-543714, Decision of Refusal drafted Sep. 21, 2018", (Sep. 21, 2018), 7 pgs.
"Japanese Application No. JP2016-543714, Notification of Reasons for Refusal drafted May 11, 2018", (May 11, 2018), 12 pgs.

* cited by examiner

LOW PROFILE MAGNETORESISTIVE IMAGING SENSOR ARRAY

PRIORITY CLAIM TO RELATED APPLICATIONS

This application is a U.S. national stage application filed under 35 U.S.C. § 371 from International Application Serial No. PCT/CN2014/095246, which was filed 29 Dec. 2014, and published as WO2015/101244 on 9 Jul. 2015, and which claims priority to Chinese Application No. 201310750924.9, filed 31 Dec. 2013, which applications and publication are incorporated by reference as if reproduced herein and made a part hereof in their entirety, and the benefit of priority of each of which is claimed herein.

TECHNICAL FIELD

The present invention relates to the technical fields of currency detection, magnetic read heads, imaging and the like, and in particular, to a low profile magnetoresistive imaging sensor array and chip-level packaging.

BACKGROUND ART

The maximum diameter of a physical area for high-resolution dotting on paper is 25 μm. An electronic image detector reads such a minute image from a medium and converts the image into an electric signal which is generally in a digital data format, and then the image or data can be displayed on a screen or be replicated.

Reduction printing is mainly used in the fields of banknote printing, photocopying, watermarking and paper document security. These fields have different sensing requirements because data can be presented in various formats, for example, using magnetic ink or optical ink. Besides, the printing format is scarcely limited, and a printed character or target may appear at any position of a medium, may have any shape and may use ink or marks of any intensity.

Medium reading systems are mainly divided into two types, namely, a scan reading system and a fixed reading system. The fixed reading system can keep a reader and a medium relatively still, for example, a digital camera sensor array. The scan reading system operates by making a medium move relative to a scanning read head, for example, a flatbed scanner, a credit card reader and most of currency detectors.

Before introduction of e-readers and scanners, there is not much need to make printed matters smaller than what can be seen by the human eyes. However, with rapid development of reduction printing and scanning technologies, there is a need and an opportunity to read printed matters smaller than 25 μm, and moreover, the existing digital scanning speed is not high and the scanning quality is not good enough. As for the quality of stored scanned images, optical scanning is better than magnetic scanning. Therefore, a magnetic scanning head with higher spatial resolution is really needed, a magnetic scanning system capable of providing a magnetically printed image of high fidelity is also needed, and the fidelity of the magnetically printed image is limited to relative geometric positions of elements on the sensing system, the quantity of induction elements on the scanning head and the requirement of distributing the magnetic field of the image along multiple coordinate axes.

As for the problem in the prior art of low resolution of a magnetoresistive imaging sensor, the present invention is directed to improve the spatial resolution of an image from a magnetoresistive imaging sensor array by reducing the spacing between the magnetoresistive imaging sensor array and a medium. The spacing aspect ratio is a parameter for roughly estimating the spacing required to distinguish two different magnetic induction targets. Based on the objective of the present invention, the spacing aspect ratio is defined as: a ratio of a distance (A) between the magnetoresistive imaging sensor array and the medium to a distance (B) between the two magnetic induction targets. When the spacing aspect ratio is less than 1:1, the imaging is easy; and when the aspect ratio is greater than 1:1, image signals from two adjacent objects become blurred, and it is difficult to distinguish the image. The magnetoresistive imaging sensor array generally receives the same signals from many different places, and when the spacing aspect ratio is 10:1, the resolution is extremely low. Besides, the amplitude of a magnetic mark signal from the medium and the distance between the magnetoresistive imaging sensor array and the medium form a relationship of $1/A^3$, so when A is very large, not only the image is blurred but also the signal-to-noise ratio is low. Therefore, the spacing between the magnetoresistive imaging sensor array and the medium needs to be reduced as much as possible.

SUMMARY OF THE INVENTION

As for the problem in the prior art of a large spacing between a magnetoresistive imaging sensor array and a medium, the technical solution provided by the present invention to reduce the spacing between the magnetoresistive imaging sensor array and the medium includes: optimizing the arrangement of an application integrated circuit and a magnetoresistive imaging sensing element array, mounting an integrated circuit on a top surface and a bottom surface of a sensing element array substrate and on a top surface and a bottom surface of an ASIC substrate separately, and using the through-the-chip interconnections and other technologies that can reduce the spacing between the magnetoresistive imaging sensor array and the medium to replace bonding pads in the prior art, thereby achieving longitudinal electric connections. Due to the presence of the bonding pad on the sensing element array chip or the sensing element array substrate, the distance between the magnetoresistive imaging sensor array substrate and the bottom surface of a protective casing is increased by 100 to 200 μm, bumps for protection and insulation purposes on the bonding pad further increase this distance, and the typical thickness of a protective casing is 100 to 200 μm. It can be seen that, the new design of the present invention can reduce the distance between the medium and the imaging sensor array by 50%.

The present invention provides the following technical solution:

A low profile magnetoresistive imaging sensor array, for reading an image from a medium carrying a magnetic mark, and comprising an electronic subassembly, wherein the electronic subassembly comprises:

a) at least one sensing element array, and the sensing element array comprising at least one magnetoresistive sensing element;

b) at least one sensing element array substrate, each sensing element array being located on a top surface of one sensing element array substrate, and each sensing element array substrate further comprising a bottom surface;

c) an induction plane, the induction plane passing through the geometric center of the sensing element array and being parallel to the top surface of the sensing element array substrate;

d) a system circuit network, the system circuit network comprising one or more application integrated circuits electronically connected to the sensing element array;

in a direction toward the medium, the electronic subassembly has a maximum extension plane parallel to the induction plane, a maximum extension distance is formed between the induction plane and the maximum extension plane, and by means of the position arrangement and electric connection of the integrated circuit and the sensing element array substrate that reduces the maximum extension distance, the maximum extension distance is made to be less than or equal to 150 µm.

Preferably, a part of or all the plurality of application integrated circuits are integrated on a top surface and/or a bottom surface of an ASIC substrate.

Preferably, the ASIC substrate is located below the bottom surface of the sensing element array substrate on which the sensing element array functionally supported by the ASIC substrate is located, and one ASIC substrate supports the sensing element array of any quantity.

Preferably, the ASIC substrate and the sensing element array substrate on which the sensor element sub-array functionally supported by the ASIC substrate is located are placed in parallel on a rigid support; one ASIC substrate supports the sensing element array of any quantity; and the top surface of the ASIC substrate is lower than the induction plane.

Preferably, a part of or all the plurality of application integrated circuits are integrated on the top surface and/or bottom surface of the sensor element array substrate.

Preferably, the system circuit network includes through chip vias and/or solder bumps, and the through chip vias and/or solder bumps provide a part of or all the longitudinal electric connections to the system circuit network.

Preferably, the longitudinal electric connections provided by the through chip vias include the longitudinal electric connection from the top surface of the sensing element array substrate to the bottom surface of the sensing element array substrate and/or from the top surface of the ASIC substrate to the bottom surface of the ASIC substrate and/or the longitudinal electric connection from the sensing element substrate to the ASIC substrate.

Preferably, the low profile magnetoresistive imaging sensor array includes a power source and a signal output/input device, wherein the power source and the signal output/input device are electrically connected to the system circuit network.

Preferably, the low profile magnetoresistive imaging sensor array includes a flexible printed circuit and/or a PCB, wherein the flexible printed circuit and/or the PCB provides a part of or all the required electric connections to the system circuit network; and the power source and the signal output/input device are formed on the flexible printed circuit and/or the PCB.

Preferably, the electronic subassembly has a housing externally, the housing has a housing top surface and a housing bottom surface, and the maximum distance between the housing bottom surface and the induction plane is less than or equal to 150 µm.

Preferably, the low profile magnetoresistive imaging sensor array includes a permanent magnet located below the sensing element array substrate and a magnetic bias device located between the permanent magnet and the sensing element array substrate.

Preferably, the magnetoresistive sensing element is a TMR, an AMR, a GM and/or a Hall sensing element.

Preferably, the application integrated circuit includes one or more of a power circuit, a power selection switch, an element selection circuit, a differential amplification circuit, an ADC circuit, a rapid memory circuit, an image memory circuit, a long-term memory circuit, an MCU circuit and an input/output circuit, a data analyzer and a data signal converter.

Preferably, the low profile magnetoresistive imaging sensor array includes a filler, wherein the filler forms a protective layer on the electronic subassembly, and the protective layer is or is not spaced from the electronic subassembly.

Preferably, the low profile magnetoresistive imaging sensor array includes a filler filled in a gap between the housing and the electronic subassembly and covered on the electronic subassembly.

Compared with the prior art, the present invention has the following beneficial effects: the low profile magnetoresistive imaging sensor array of the present invention features good performance, excellent quality and low cost, and has higher spatial resolution, higher signal-to-noise ratio, more compact detecting system, smaller volume and lower cost and is firmer and more durable as compared with the existing products of the same type.

The above description is merely a general introduction of the technical solution of the present invention. To illustrate the technical means of the present invention more clearly and to implement the present invention according to the content of the specification, the present invention is described in detail below with reference to embodiments and the accompanying drawings. The specific implementation manners of the present invention are provided in detail in the following embodiments.

BRIEF DESCRIPTION OF THE DRAWINGS

The accompanying drawings of the specification are provided for further understanding of the present invention and form a part of the present application. The exemplary embodiments of the present invention and the descriptions thereof are used to explain the present invention, instead of inappropriately limiting the present invention.

DETAILED DESCRIPTION OF THE PREFERRED EMBODIMENTS

The present invention is described in detail below with reference to embodiments and the accompanying drawings.

Figure 1:
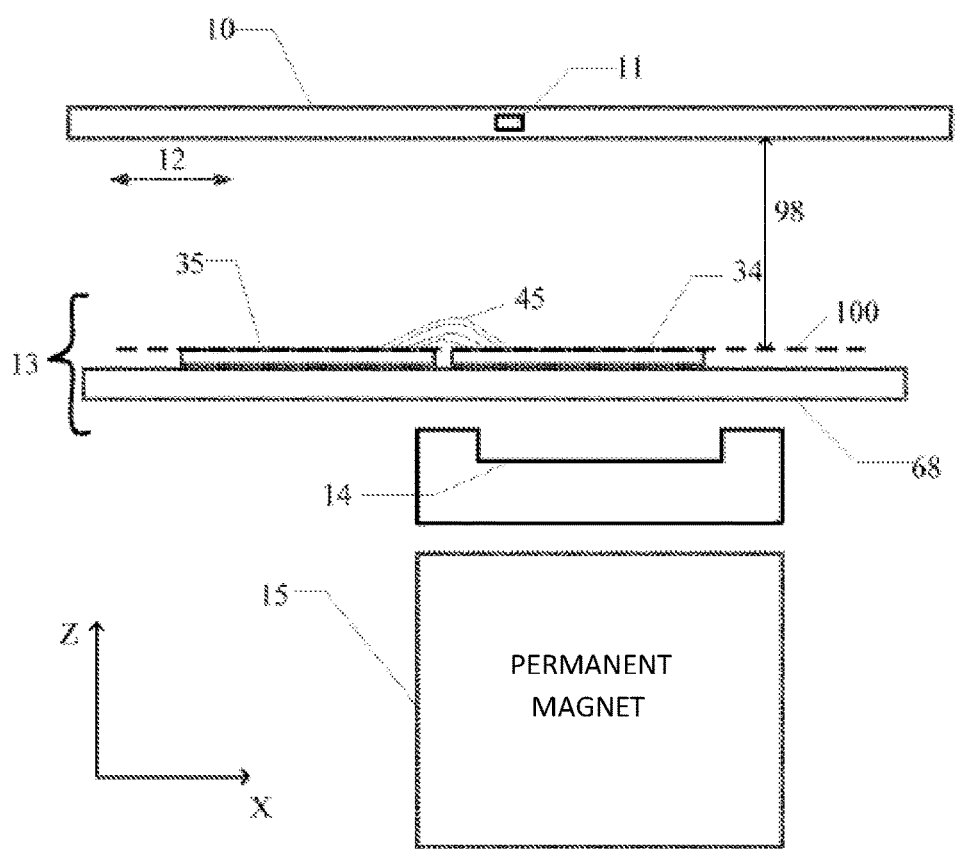
FIG. 1 is a side view of a magnetoresistive imaging sensor array in the prior art.
Figure 2:
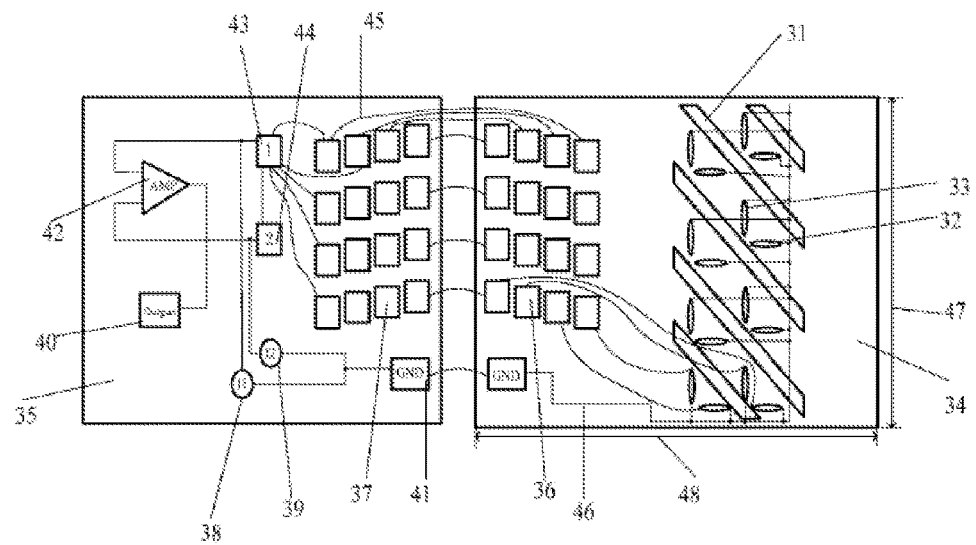
FIG. 2 is a top view of the magnetoresistive imaging sensor array in the prior art.
Figure 2:
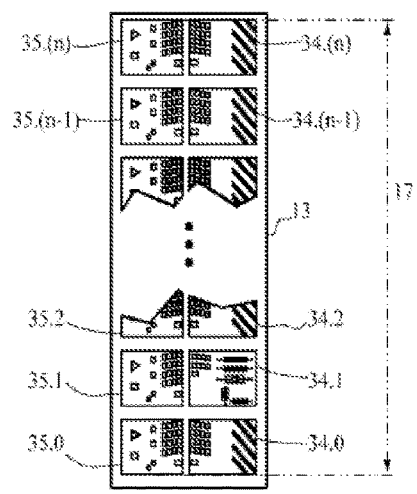

FIG. 1 and FIG. 2 show a magnetoresistive imaging sensor array in the prior art and the defect thereof as well as basic knowledges for designing and using the magnetoresistive imaging sensor array. The description about the design of the low profile magnetoresistive imaging sensor array in the present invention starts from FIG. 3. Specifically, the magnetoresistive imaging sensor array is a magnetic medium scanning head. FIG. 1 shows a medium 10 passing through the sensor array 13, where the medium 10 may be an entire bill or an entire piece of paper moving along an axial medium moving direction 12, and this axis is parallel to an X-axis 1. A standard coordinate system is shown in the lower right corner of FIG. 1, and the coordinate system has the X-axis 1, a Y-axis 2 (along a paper inward direction) and a Z-axis 3. A common motor and/or roller is used to drive the medium to move.

The sensor array 13 includes two types of substrates: a sensor array sub-chip 34 and an ASIC substrate 35 which are electrically connected by using bonding pads 45. The bonding pad 45 is about several hundreds of micrometers above the substrate plane, which is in the same order of magnitude as the thickness of the sensor array sub-chip 34 and the thickness of the ASIC substrate 35. The height of the bonding pad is the main problem in the prior art because it is impossible for the medium 10 to get closer to induction elements approximately located on the induction plane 100 due to this height.

Many magnetoresistive induction elements are provided on the sensor array sub-chip 34 and are located on a top surface of the chip, the top surface is approximately parallel to the X-Y plane and the larger surface of the medium 10, and more details about the design will be shown in the figures below. A permanent magnet 15 magnetizes along the positive direction of the Z-axis and can magnetize a magnetic bias device 14 of a soft ferromagnet, and such a permanent magnet 15 of a large size and capable of producing a high-intensity magnetic field can magnetize an ink character 11 on the medium 10. The sensor array chip 34 is placed close to the magnetic mark 11 on the medium 10, and is thus capable of measuring the magnetic field on the ink character 11. The design of the magnetic bias device 14 can reduce the intensity of the magnetic field on the induction surface of the sensor array 13 in the X-Y plane, and the details about this modification have been described in Chinese Patent Application No. 201210424954.6 titled "MAGNETICALLY-BIASED MAGNETIC CURRENCY DETECTION HEAD WITH SENSITIVITY DIRECTION PARALLEL TO DETECTION SURFACE".

FIG. 2 is a partial top view of the sensor array 13 in FIG. 1, and the plane of the figure is parallel to the X-Y plane. The X-axis induction element 32 and the Y-axis induction element 33 are induction elements in the array and are located on the induction plane 100. The entire sensor array 13 is composed of several sub-chips 34, 34.1, 34.2, . . . , 34.n, where 34.n represents that there are n chips in one row. The entire array is shown in FIG. 2B. The value of n is about AW17/CW47, where AW17 is the width of a sensor array, CW47 is the width of a chip, and CL48 is the length of each sub-chip. FIG. 2A is a near view of a pair of sub-chips 34 and 35. The bar-shaped permanent magnet 31 on the chip is located on the top surface of the sensor array sub-chip 34.

FIG. 2 also shows one set of ASIC chip 35, and multiple ASIC chips 35 may also be provided corresponding to the sensor array sub-chips 34. The quantity of the ASIC chip is not limited to the quantity shown in the figure and may be set to n, where n is a natural number. The quantity of the ASIC chip 35 is not necessarily the same as that of the sensor array sub-chip 34. In this embodiment, each X-axis induction element 32 and each Y-axis induction element 33 have one sensor chip wire-bonding pad 36 and one wire-bonding pad for grounding connection, so 17 wire-bonding pads are provided in total. A group of matching ASIC wire-bonding pads 37 are arranged on the edge of the ASIC chip 35, and the bonding wires 45 are used for electrically connecting adjacent chips. Each X-axis induction element 32 and each Y-axis induction element 33 have two electric connection points, one of the electric connection points is connected to a common GND on the chip and the other electric connection point is connected to the sensor chip wire-bonding pad 36 by using a conductor 46 on the chip.

Some wire-bonding pads are placed along the edge of the ASIC chip 35 in a matching manner, or can be randomly selected by the sensor array through multiple multiplexers. Two multiplexers are shown in the figure, namely, a first multiplexer 43 and a second multiplexer 44, and each multiplexer is of a typical 16:1 type, that is, using one output end to connect to 16 input ends. The type of the multiplexer and the quantities of the input ends and the output ends may be adjusted according to the requirements of the application design. A current source I1 38 and a current source I2 39 are respectively connected to the GND 41, the first multiplexer 43 and the second multiplexer 44, and in this way, each of the 16 induction elements 32, 33 on the sensor array sub-chip 34 can be electrically connected to the current source I1 38 or the current source I2 39.

An amplifier 42 as a differential amplification stage has two input ends, one from the current source I1 38 and the other from the current source I2 39. An output signal from the amplifier 42 is referred to as an output 40. The two current sources and the two selected induction elements together form a "pseudo-full bridge". Based on the objective of this patent application, the "pseudo-full bridge" refers to an electronic resistance measuring device having two (left and right) output ends, each end has a current source for supplying current to a resistor to be measured, the potential difference between the two ends is a bridge output signal, and more types of electronic measuring devices will be shown in the subsequent figures.

FIG. 1 and FIG. 2 fully explain the basic operation principle of the detection of a magnetic mark on a currency note and other media by the magnetoresistive imaging sensor array. The introduction of the modification made in the present invention on the prior art starts from FIG. 3.

Figure 3:
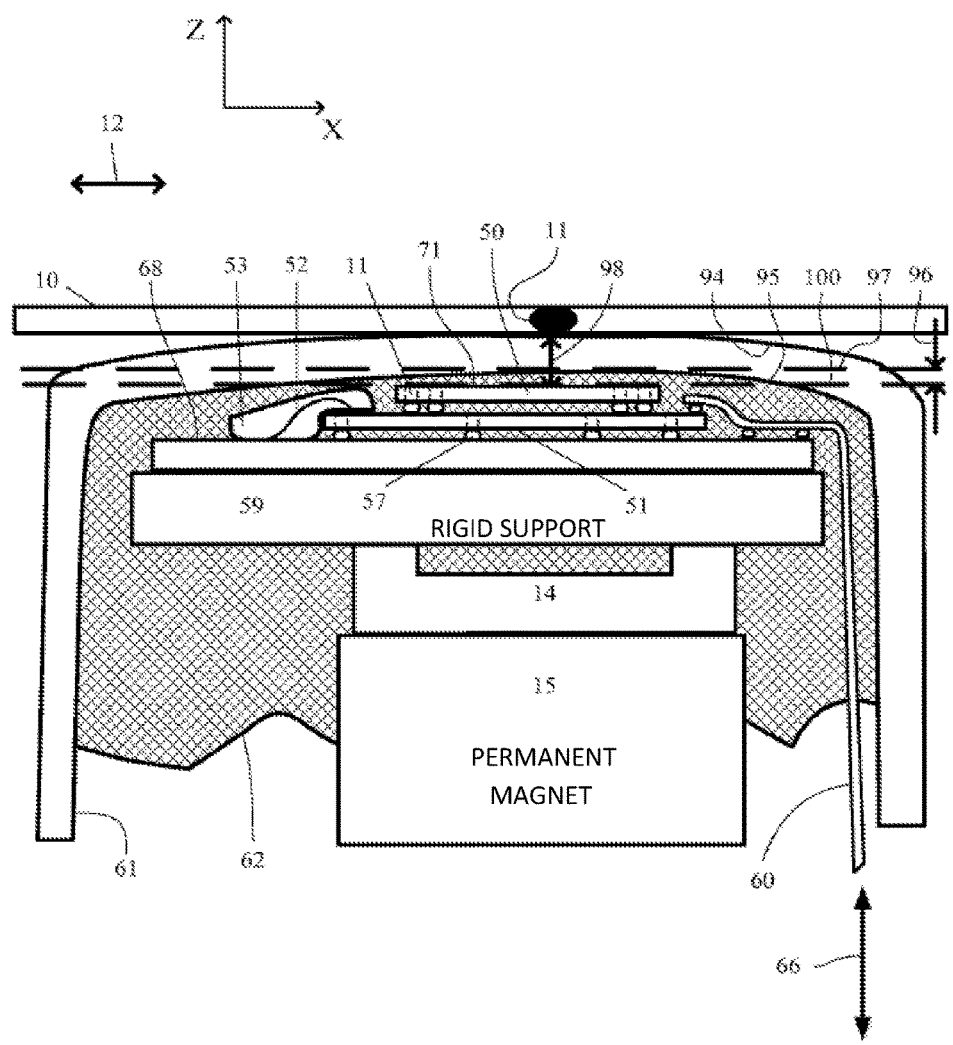
FIG. 3 is a side view of a low profile magnetoresistive imaging sensor array in the present invention.

FIGS. 3 to 6 show a first embodiment of the present invention. FIG. 3 is a cross-sectional view of all the induction parts in the magnetoresistive imaging sensor system, which include at least one sensing element array, at least one sensing element array substrate 50, and multiple application integrated circuits electronically connected to the sensing element array. An induction plane 100 passes through the geometric center of the sensing element array. The sensing element array includes at least one magnetoresistive sensing element, and the existing magnetoresistive sensing element includes a Hall element, an Anisotropic Magnetoresistance (AMR) element or a Giant Magnetoresistance (GMR) element and a TMR (Tunnel MagnetoResistance) element. The TMR technology is the most advanced technology and is also a preferred technology of the present invention, while other magnetoresistive induction elements may also be used in the present invention. In a direction toward the medium, the electronic subassembly of the present invention has a maximum extension plane parallel to the induction plane, the maximum extension plane is the lowest plane above all the electronic sub-assemblies in the Z-axis direction, a maximum extension distance is formed between the induction plane and the maximum extension plane, and by means of the position arrangement and electric connection of the integrated circuit and/or the sensing element array substrate that reduces the maximum extension distance, the maximum extension distance is made to be less than or equal to 100 or 150 μm.

Similar to FIG. 1, the medium 10 moves from left to right along the medium moving direction 12, and the magnetic mark 11 moves along with the medium 10 and is detected. Similar to FIG. 1 of the prior art, the permanent magnet 15 is used for producing a bias magnetic field along the positive direction of the Z-axis, to magnetize the soft magnetic bias device 14 and the magnetic mark 11. The sensing element array substrate 50 has a top surface 63 and a bottom surface 64. The sensing element array 65 is located above the sensing element array substrate 50.

The difference between this embodiment and the existing design shown in FIG. 1 and FIG. 2 is that, the sensing element array substrate 50 and the ASIC substrate 51 are longitudinally arranged, and specifically the sensing element array substrate 50 is placed above, instead of in parallel to, the ASIC substrate 51. The bonding pads 52 are still used for a part of the electric connections, and are located on the ASIC substrate 51 at a lower position instead of on the sensing element array substrate 50. Bumps 53 are an adhesive or a polymer, for providing electric insulation to the bonding pad 52 and preventing physical damages from occurring in the bonding pad 52. The top part of the bump 53 is preferably lower than the top end of the sensing element array substrate 50. The IN-CHIP Electrical Vias are used to partially or completely replace the bonding pads 52 to provide the electric connections between the sensing element array 65 located on the top surface 63 of the sensing element array substrate 50 and the ASIC substrate as well as other parts of the magnetoresistive imaging system, and are referred to as Through Chip Vias 55, that is, TCVs 55 for short in the present invention. The "top surface" of an object mentioned in the present invention refers to a surface having the maximum value in the Z-axis direction, and the "bottom surface" of an object refers to a surface having the minimum value in the Z-axis direction. The other parts for the above longitudinal electric connections are solder bumps 57, that is, small-sized solder balls made of a soldering material. These small-sized solder balls provide rigid mechanical connection, and also provide electric connection between the ASIC substrate 51 and the sensing element array substrate 50. A connecting conductor TCV that longitudinally connects from the top surface to the bottom surface of the ASIC substrate 51 may also be adopted in the ASIC substrate 51 and provides electric connection thereto. The ASIC substrate 51 is directly placed on a PCB 68, and the sensing element array substrate 50 is located on the ASIC chip 51. The optional mechanical support is a rigid support 59 made of rigid plastics, ceramics, glass fiber or non-magnetic metal.

Figure 10:
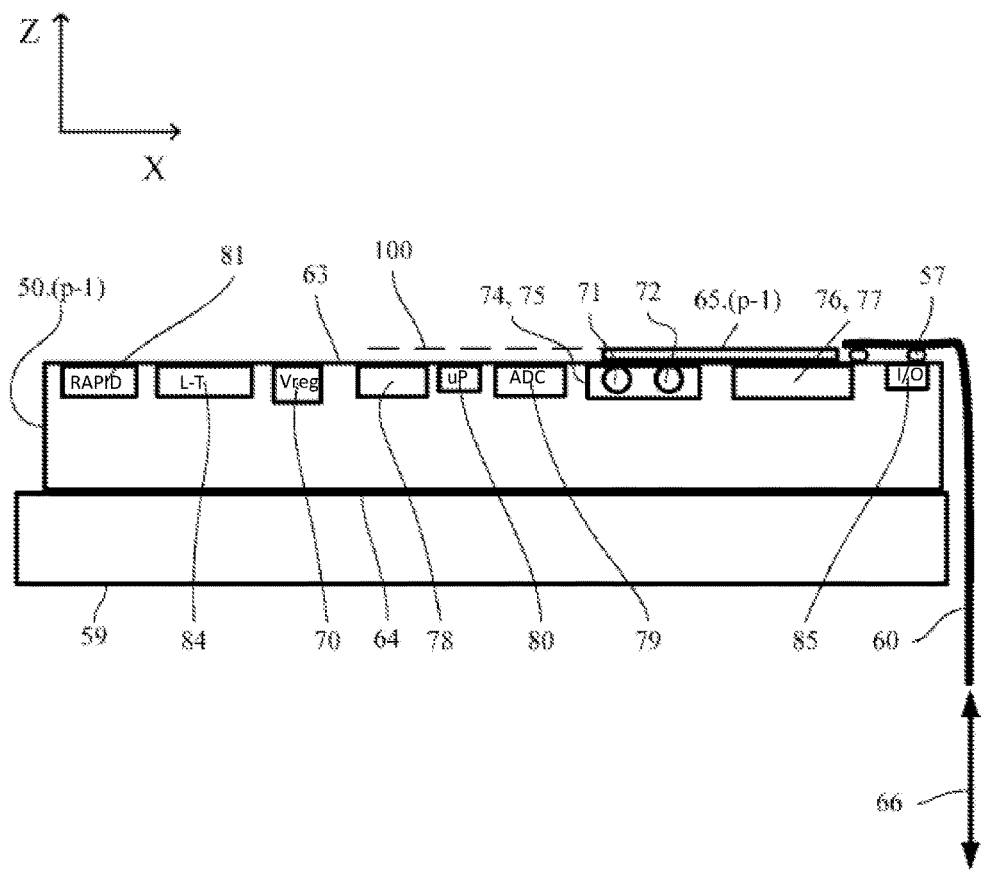
FIG. 10 is an enlarged view of a single-chip design without TCVs.

A flexible printed circuit 60 extends out of the edge of the filler 62 to be connected to an external power source and a signal output/input device 66. The flexible printed circuit 60 may be connected to the PCB 68 and the ASIC substrate 51 through the solder bumps 57. The flexible printed circuit 60 may also be connected to the top surface 63 of the sensing element array substrate 50, but this connection manner may result in an increase in the height of the assembly of the magnetoresistive imaging sensor array above the induction plane 100, thereby increasing the distance 98 between the magnetoresistive imaging sensor array 71 and the medium 10, and this embodiment is shown in FIG. 10. The housing 61 is thin and wear-resisting, has a typical thickness of about 200 μm, is usually made of non-magnetic stainless steel, and is generally electrically grounded to prevent electrostatic accumulation. The housing 61 has a surface that is farthest away from the magnetoresistive imaging sensor array 71 in the Z-axis direction, that is, a housing top surface 94, and a surface that is nearest to the magnetoresistive imaging sensor array 71 in the Z-axis direction, that is, a housing bottom surface 95. The housing 61 needs to be thin to achieve a minimum total distance 98 from the magnetoresistive imaging sensor array 71 to the medium 10.

In the production, the sensing element array substrate 50, the ASIC substrate 51 and the unmelted solder bumps 57 are together placed on the PCB 68 and/or the flexible printed circuit 60 to form a subassembly. The subassembly is heated up to a temperature exceeding the melting point of the soldering material, and the solder bumps 57 are melted. After that, the subassembly is placed on the magnetic bias device 14, the permanent magnet 15 and the rigid support 59, and is then placed in the housing 61 by means of a detachable mechanical gripper. The filler 62 is generally a liquid that can flow among the elements in the magnetoresistive imaging sensor array system during the production and can be solidified by curing for the purpose of electric insulation or structural support. A method for adding the filler 62 is that, the assembly of the low profile magnetoresistive imaging sensor array in FIG. 3 is turned over, the filler can be added in the housing 61 and is cured, and the filler 62 is led into a specified position under the effect of gravity and is then cured. Another method is to form a closed plastic cavity using another external mold. The filler 62 is filled in most of the vacant space in the housing 61 to form the aforementioned cavity.

To achieve the characteristics of electric insulation and mechanical strength, the filler 62 is typically made of 2-part epoxy resin, thermosetting resin and non-thermosetting plastics. In some circumstances, sealing needs to be performed along the sensing element array substrate 50 and the ASIC substrate 51. The permanent magnet bar 15 can be completely sealed by the filler 62 or may be partially sealed as shown in the figure.

The present invention has three different levels of packaging:

1. the electronic subassembly or pure sensor array assembly, including all the magnetic elements and electronic elements of the low profile magnetoresistive imaging sensor array except for the housing 61 and the filler 62;

2. the molded subassembly, including the electronic subassembly and the filler 62;

3. the enclosed assembly, including the housing 61 and the packaged electronic subassembly.

In the embodiment of the electronic subassembly, the low profile magnetoresistive imaging sensor array 71 does not have the protective housing 61 and the filler 62. In general circumstances, a protective gap filled with air is provided between the electronic subassembly and the medium 10.

In the embodiment of the molded subassembly, the magnetoresistive imaging sensor array 71 has a protective layer between the position of the medium 10 and the magnetoresistive imaging sensor array 71. The protective layer may be provided by the filler 62. The filler 62 may also provide mechanical support and a bonding effect for the elements of the electronic subassembly. The filler 62 needs to be made of a strong and wear-resisting material, and the medium 10 may be or may not be in contact with the protective layer, that is, a gap exists between the molded subassembly and the medium 10 in the non-contact state.

In the embodiment of the enclosed assembly, the magnetoresistive imaging sensor array 71 has a protective housing 61 between the position of the medium 10 and the magnetoresistive imaging sensor array 71. This embodiment generally includes the filler 62 which is optional. The filler 62 provides a supporting and bonding effect for the elements of the magnetoresistive imaging sensor array 71 and the housing 61. The housing 61 may be in direct contact with the medium 10.

The above three packaging methods may be used in combination with all the embodiments of the arrangement of the integrated circuits and chips in the present invention.

A maximum extension surface 97 parallel to the induction plane 100 exists in the direction of the medium 10. The maximum extension plane 97 is used in the above three packaging methods, and a maximum extension distance 96 exists between the induction plane 100 and the maximum extension plane 97. All the elements and the electric connections of the pure sensor array assembly are located below the maximum extension plane 97. The definition of the pure sensor array assembly allows the presence of some configurations like mechanical pulling guide-rails and structural supports, and only these configurations extend, in the Y-axis direction, out of the plane where the medium 10 is located, that is, they exceed the medium width 16 shown in FIG. 4.

Figure 4:
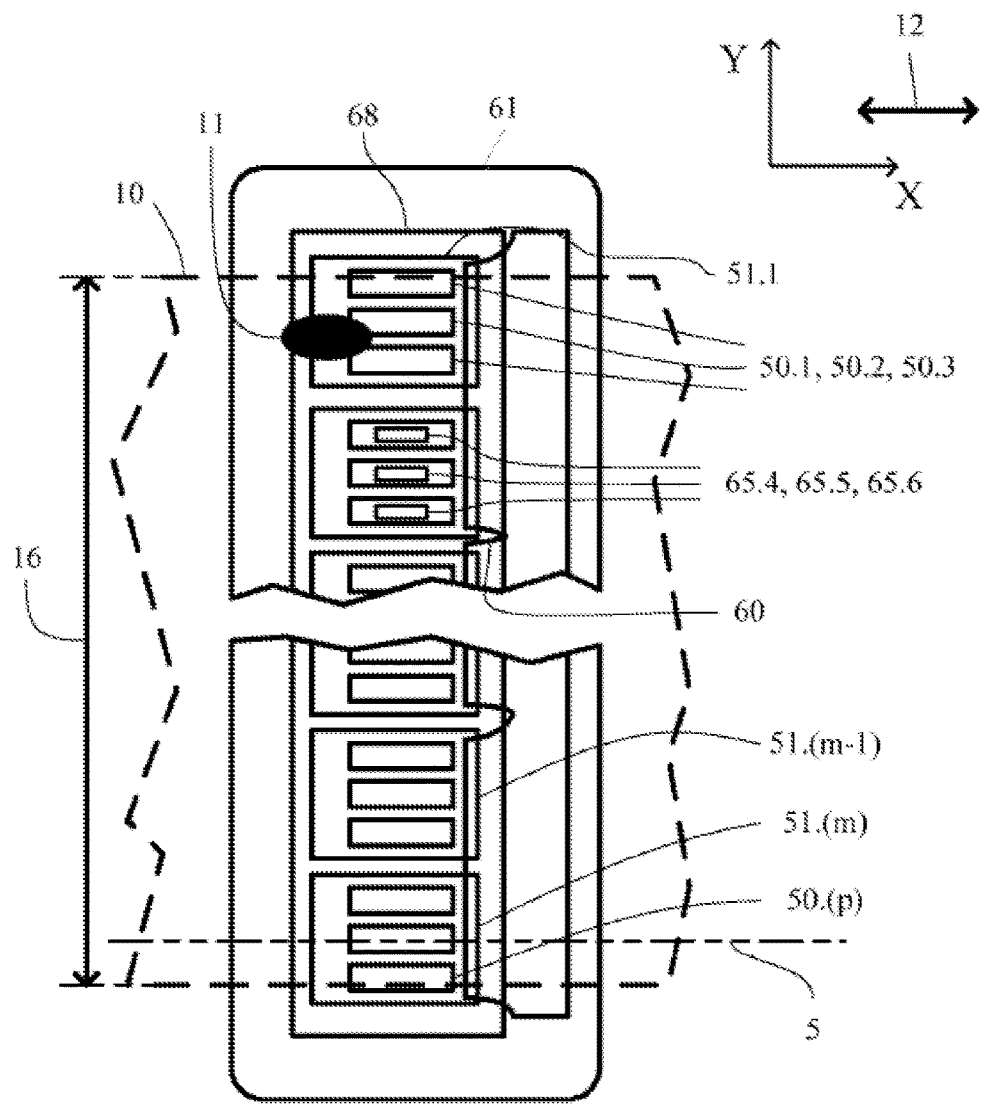
FIG. 4 is a top view of the low profile magnetoresistive imaging sensor array in the present invention.

FIG. 4 is a top view of FIG. 3. Many details are omitted to obtain a clear view. The medium moving direction 12 is the X-axis direction. The X-Y plane is shown in the figure, and the Z-axis is out of the plane. The contour line indicates the outline of the medium 10. FIG. 4 shows the entire width of the medium 10 in the Y-axis, that is, the medium width 16. To obtain a clear view, the long side of the medium 10 in the positive direction and negative direction of the X-axis is partially omitted. The dot-and-dash line 5 indicates the part of FIG. 4 from which the cross-section in FIG. 3 is depicted. One PCB 68 supports m ASIC substrates 51. To obtain a clear view, only the ASIC substrates 51.1, 51.($m-1$) and 51.($m$) are marked in the figure. In this embodiment, each ASIC substrate 51 supports three magnetoresistive imaging sensor element sub-array substrates 50, where 3 is actually a compulsory numerical number that may be any other numerical number. The sensing element array substrates 50.1, 50.2, 50.3 and 50.$p$ are marked. Each magnetoresistive imaging sensor element array substrate 50 has a sensing element array 65, and only 65.4, 65.5, 65.6 are shown in the figure and the others are omitted. To obtain a clear view, the total width of the magnetoresistive imaging sensor array 71 is partially omitted. The housing 61 is slightly larger than the outer edge of the PCB 68. The flexible printed circuit 60 shown in the figure is a single circuit, and may also be divided into several parallel flexible printed circuits; no matter in which manner, the external electric connections all need to pass through one or more flexible printed circuits 60. To obtain a clear view, the magnetic mark 11 is disproportionally shown at a position different from that in FIG. 3. If each sensor element array 65 includes E induction elements, the quantity of the induction elements in the magnetoresistive imaging sensor array 71 is $N=E*p.(n)$.

Figure 5:
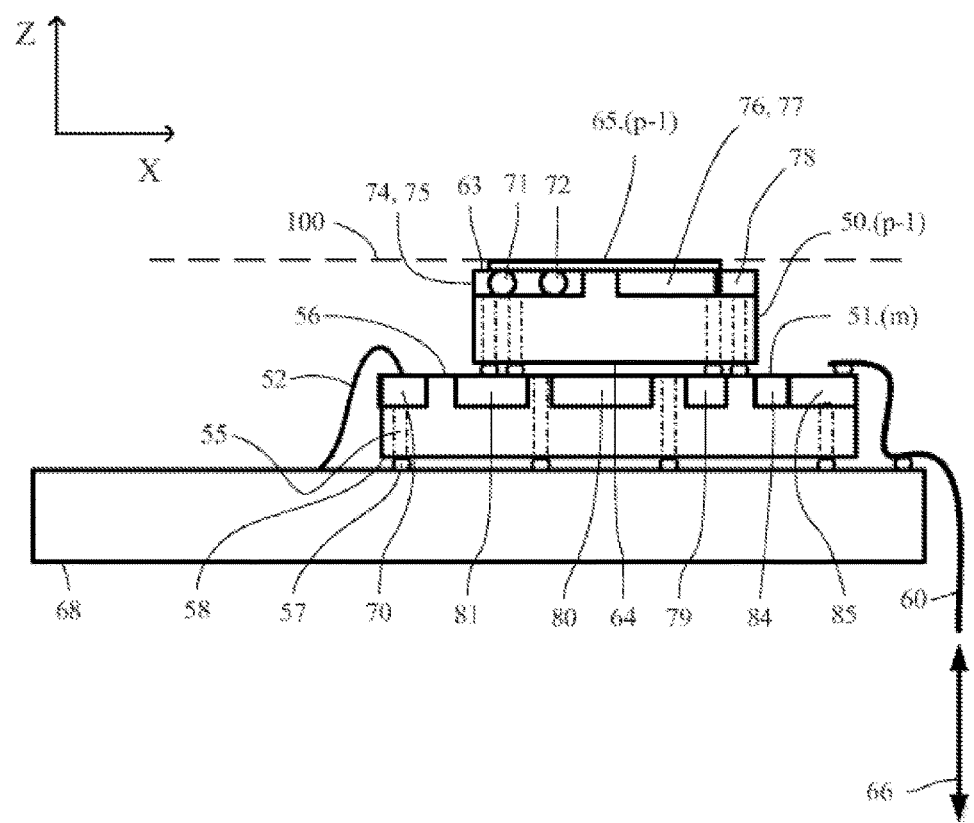
FIG. 5 is an enlarged cross-sectional view of the low profile magnetoresistive imaging sensor array in the present invention.

FIG. 5 is an enlarged cross-sectional view of the assembly of the low profile magnetoresistive imaging sensor array in FIG. 3. The present invention is mainly directed to minimize the height of the magnetoresistive imaging sensor array in the Z-axis direction, that is, to minimize the distance 98 between the induction plane 100 and the bottom of the medium 10, so FIG. 5 shows in detail the necessary characteristics of a circuit system of the low profile magnetoresistive imaging sensor array in the Z-axis direction. FIG. 5 is a view showing preferable positions of the main functional elements in the circuit. The main functions of the circuit in FIG. 5 are also shown in the flow chart of FIG. 6. It should be noted that, the functional elements of the circuit may be arranged in different manners according to the spirit of the present invention.

The cross-section in FIG. 5 passes through the centers of the sensing element array 65.($p-1$) and the sensing element array substrate 50.($p-1$) located on the ASIC substrate. The magnetoresistive imaging sensor array 71 includes all the sensing element arrays 65. The sensing element arrays 65 are located on the sensing element array substrates 50 in a one-to-one corresponding manner. The sensing element array substrates 50 are completely the same in this embodiment, and may be different in other embodiments. The sensing element array 65 is located on a standard CMOS silicon-based circuit structure formed in the sensing element array substrate 50. The sensing element array 65 is made by plane fabrication processes well-known in this field, such as metal thin-film deposition, patterning and etching; shielding thin-film deposition, patterning and etching; photolithography, electroplating and other similar methods. Most of the circuits and the sensing element arrays 65 located on the top surface 63 of the sensing element array substrate 50 are made in this manner. The total thickness of the sensing element array 65 is in the order of magnitude of 1,000 nm; and to be viewed clearly, the thickness of the sensing element array 65 is amplified in FIG. 5. Some conductive layers of the sensing element array 65 are in different shapes to facilitate the electric connections of the CMOS circuit elements and the 2-dimensional magnetoresistive imaging sensor array 71. The nanoscale sensing element arrays 65 have non-zero thickness and irregular shapes, and thus cannot be accurately confined in a 2-dimensional plane. To achieve the objective of the present invention, the induction plane 100 is defined as a plane passing through the sensing elements in most of the sensing element arrays 65, and all the sensing elements are within an area from 10 μm above the induction plane 100 to 10 μm below the induction plane 100 (or the total thickness of the area is 20 μm). The top surface 63 of the sensing element array substrate 50 is parallel to the induction plane 100. Some special or additional processes are needed to lead the electric connections through the substrate to reach the bottom surface or to reach below the bottom surface. The TCVs 55 provide required electric connections to the elements located on the top surface 63 and the bottom surface 64 of the sensing element array substrate 50. The TCVs 55 also provide required electric connections to the elements located on the top surface 56 of the ASIC substrate and the bottom surface 58 of the ASIC substrate 51.

A method for fabricating the TCVs 55 is to provide a hole by etching on a wafer where the sensing element array substrate 50 is formed, electrically shield the wall of the hole and insert a metal conductor in the hole by electroplating. Another fabrication method is to dope a semiconductor wafer at the positions of the TCVs, so that these positions have higher conductivity than other semiconductor substances nearby. The TCVs need to be electrically shielded. The typical diameter of the TCVs is 50 to 100 μm. The typical thickness of a fabricated wafer is 200 to 500 μm. As for the substrate part required by the TCVs, the space occupied thereby is not smaller than the bonding pads. The TCVs 55 have the advantages of zero height and capability of being conveniently arranged at different positions. Compared with the TCVs, the bonding pads 52 can only be arranged in rows on the periphery of the ASIC substrate 51, and largely extend in the Z-axis direction above the ASIC substrate.

Circuit structures are formed by a standard CMOS silicon-based fabrication method on the top surface 63 of the sensing element array substrate 50, and include a power source 1 (I1) 72 and a power source 2 (I2) 73; a current selection switch 1 (74) and a current selection switch 2 (75); an element selection circuit 1 (76), an element selection circuit 2 (77) and a differential amplification circuit (78). Circuit structures formed in the CMOS layer on the top surface 56 of the ASIC substrate 51 include: a voltage regulating circuit VReg 70, an analog-to-digital converter (ADC) 79, a microprocessor (MCU) 80, a rapid memory circuit 81 and a long-term memory circuit 84. The power sources and the data input/output device are connected to an external circuit by means of the flexible printed circuit 60. The electric connections between the chips (the sensing element array substrate 50 and the ASIC substrate 51) are implemented by using the TCVs 55 and the solder bumps 57.

Figure 6:
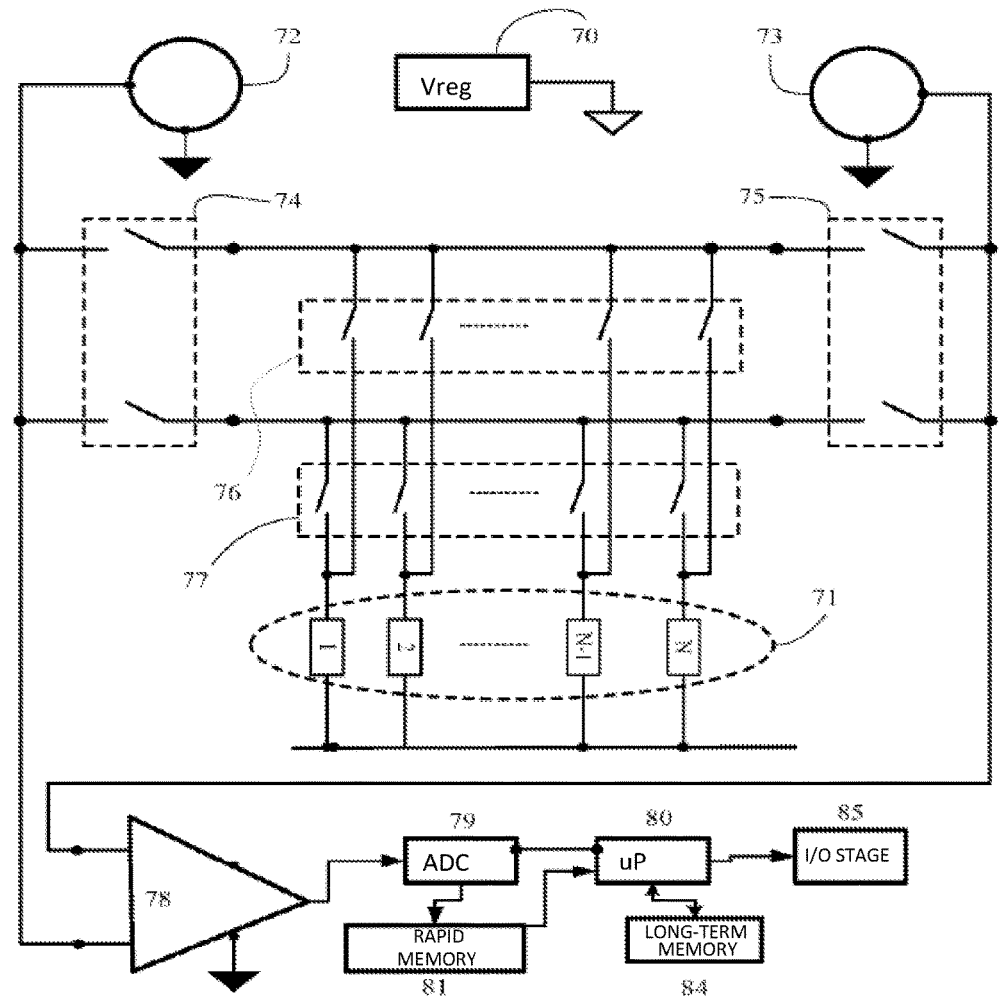
FIG. 6 is a schematic view of a magnetoresistive imaging sensor signal processing circuit.

FIG. 6 is an operating diagram of the low profile magnetoresistive imaging sensor array system. The circuit diagram in FIG. 6 describes a system circuit network of the low profile magnetoresistive imaging sensor array system. The system circuit network includes all the electric connections, circuit components and data connections defining the circuit design. The electric connections defined herein include different types of electric connections, TCVs, solder bumps, wires, leads and chips, the PCB and the patterned wires on the flexible printed circuit. A 2-dimensional induction element selection structure guides the current to the target induction element. The 2-dimensional induction element selection circuit is composed of a row and a column, which are not necessarily spatially corresponding to the X-axis and Y-axis directions. The current of the power sources 1 (72) and 2 (73) comes from the VReg 70, and is supplied to one of the N sensor elements in the magnetoresistive imaging sensor array 71. The current row selection circuits 1 (74) and 2 (75) and the current column selection circuits 1 (76) and 2 (77) are all integrated on a CMOS switch.

The differential amplification circuit 78 can amplify the difference between two input signals. The ADC circuit 79 receives amplified analog signals from the differential amplification circuit 78 and converts the analog signals into digital signals. These unprocessed digital signals can be stored in the rapid memory circuit 81. The microprocessor 80 can process these unprocessed digital signals stored in the rapid memory circuit 81 and generate images of sizes corresponding to the magnetic mark in the medium 10, and data of the images is saved in the long-term memory circuit 84 for later use. Networking to external users and systems is established through an input/output stage 85. The microprocessor 80 is in charge of digitalization, system time flow, communication, induction element selection switches, memory caching and settlement, and image processing and simulation.

Figure 7:
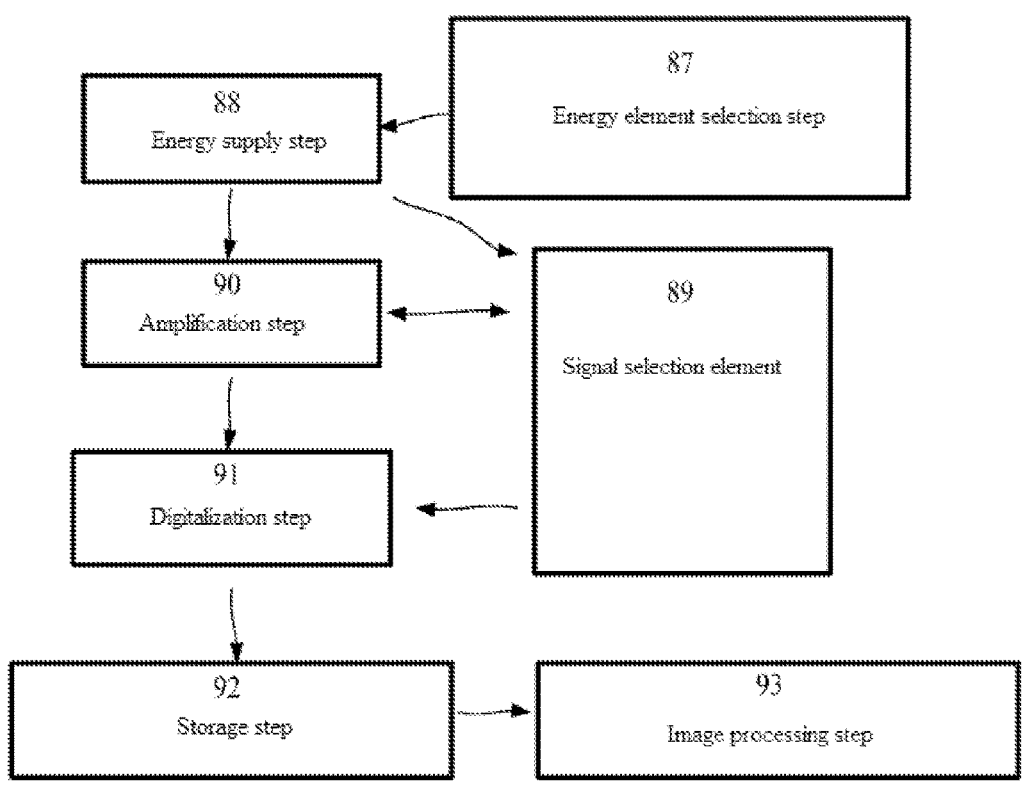
FIG. 7 is a flow chart of an operating time sequence of the imaging sensor array in the present invention.

FIG. 7 is a flow chart of a system operating time sequence. In an energy element selection step 87, a sub-array/sensing element array 65 that needs to be powered of the magnetoresistive imaging sensor array 71 is selected. In an energy supply step 88, current or voltage is supplied to the selected sub-array of the magnetoresistive imaging sensor array 71. In a signal selection step 89, a sub-array from which signals are to be collected of the magnetoresistive imaging sensor array 71 is selected. In an amplification step 90, the sub-array of the magnetoresistive imaging sensor array 71 selected by the signal selection element 89 is electrically connected to the differential amplifier 78, so as to amplify the analog current or analog voltage. In a digitalization step 91, an ADC 90 converts the analog voltage from the amplification step into a digital signal. Information from each linear induction element of the magnetoresistive imaging sensor array 71 may reach several bits. In a storage step 92, unprocessed data from the magnetoresistive imaging sensor array 71 is stored in the rapid memory circuit 81. In an image processing step 93, the unprocessed data is analyzed and converted into a data format which is a magnetic property of the medium related to the specified time and place. The digital magnetic image data from step 93 is stored in the long-term memory circuit 84.

Figure 8:
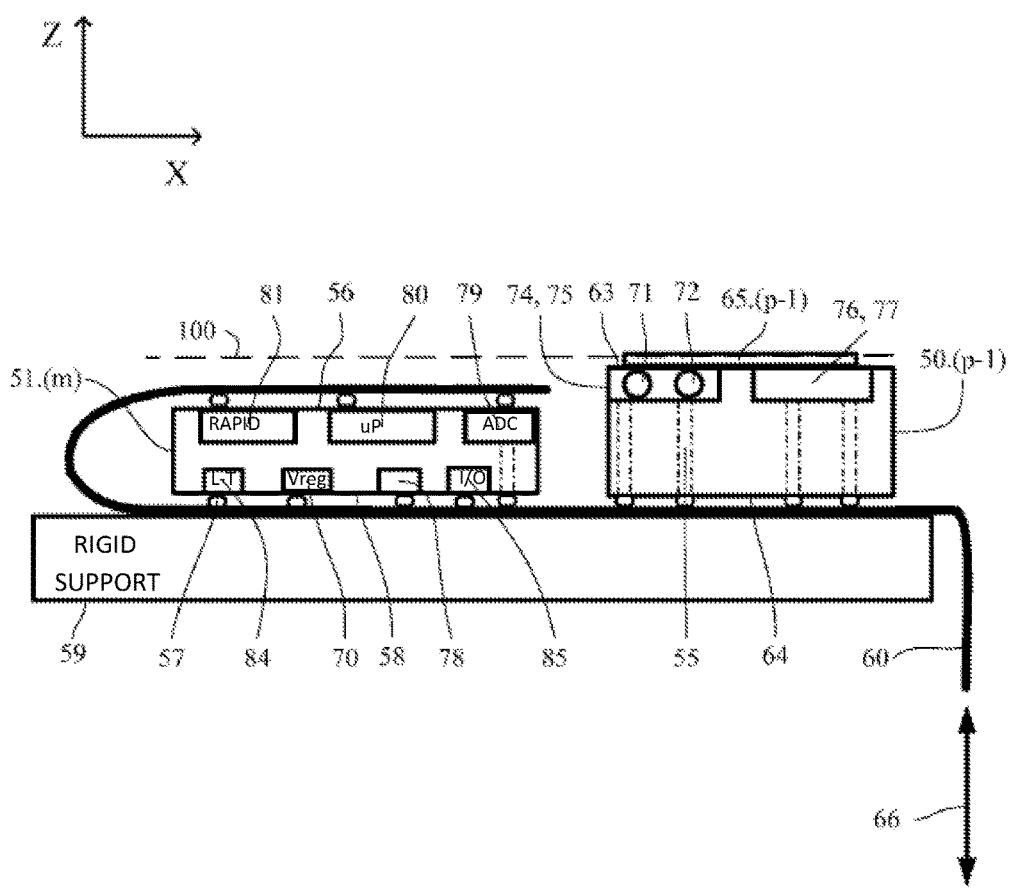
FIG. 8 is an enlarged view of a design of two chips arranged in parallel.
Figure 9:
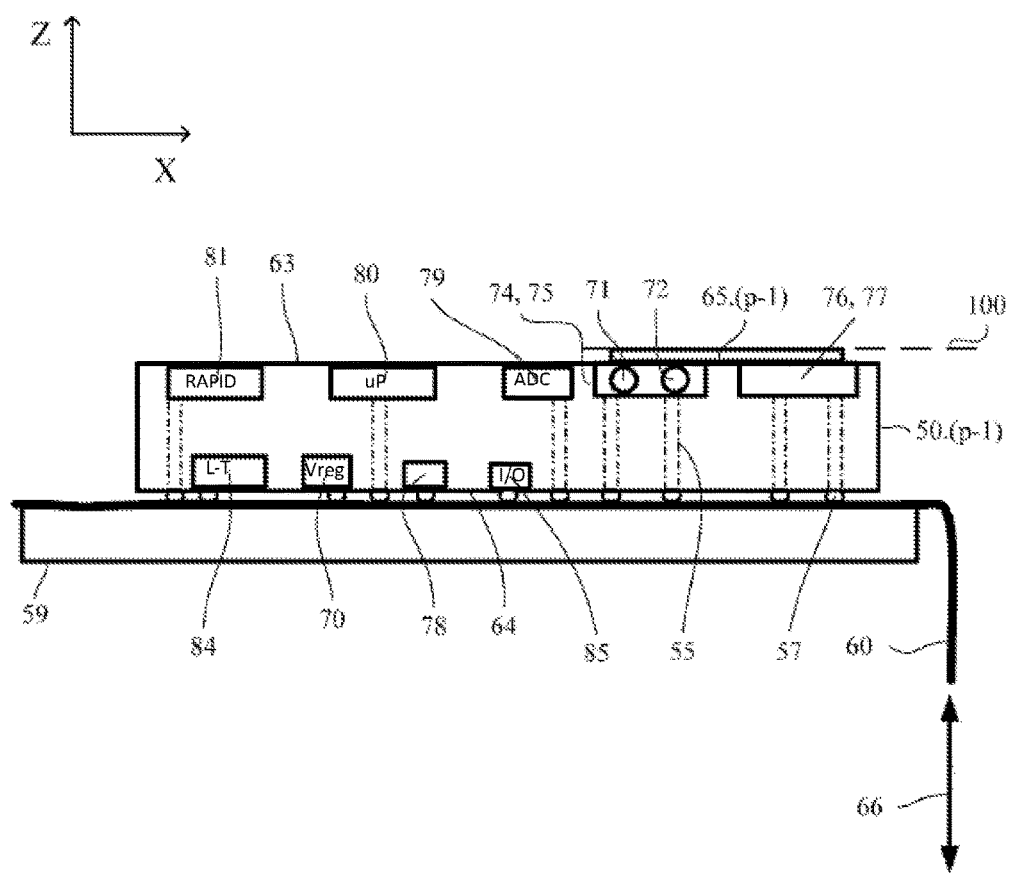
FIG. 9 is an enlarged view of a single-chip design.

Other embodiments provided by the present invention for reducing the distance 98 are shown in FIGS. 8, 9 and 10, and are variations based on the embodiment in FIG. 5.

The embodiment in FIG. 8 also has the housing 61, the permanent magnet bar 15, the magnetic bias device 14 and the filler 62 in the embodiment in FIG. 3, which are omitted in FIG. 8 to obtain a clear view. FIG. 8 differs from FIG. 5 in the following aspects. Firstly, there is no PCB, and only the rigid support 59 exists. Secondly, the flexible printed circuit 60 is in contact with the top surface and the bottom surface of the ASIC substrate 51.(*m*). Thirdly, the sensing element array substrate 50.(P−1) is arranged in parallel to, instead of above, the ASIC substrate 51.*m*. Fourthly, the ASIC substrate 51.*m* is thinner than the sensing element array substrate 50.(P−1). Due to the above differences, the flexible printed circuit 60 can be completely located below the induction plane 100, and is electrically connected to the top portions of the ASIC substrate 51.*m* and the sensing element array substrate 51.(P−1). The thickness of the chip refers to the size of the chip in the Z-axis direction.

Some configurations are the same as or functionally equivalent to the embodiment in FIG. 5. The identical elements shown in FIG. 6 are, the elements in the system circuit, such as the VReg 70, the magnetoresistive imaging sensor array 71, . . . , and the amplifier 78, that are arranged on the sensing element array substrate 50.(P−1) or the ASIC chip 51.*m*. The sensing element array 65.(*p*−1) is located on the top surface 63 of the sensing element array substrate 50.(*p*−1). Some elements of the integrated circuit are arranged at the bottom of the ASIC substrate 51.(*m*). The flexible printed circuit 60 provides electric connections to elements or devices located outside the housing 61.

FIG. 9 shows another embodiment. The embodiment in FIG. 9 also shows the housing 61, the permanent magnet bar 15, the magnetic bias device 14 and the filler 62 in FIG. 3, which are omitted in FIG. 9 to obtain a clear view. Similar to FIG. 6, the elements in the system circuit, such as the VReg 70, the magnetoresistive imaging sensor array 71, . . . , and the amplifier 78, are all arranged on the top surface 63 of the sensing element array substrate 50.(P−1). The solder bumps 57 are used for electric connections between the flexible printed circuit 60 and the elements located on the sensing element array substrate 50.(P−1). Some elements of the integrated circuit are arranged on the bottom surface 64 of the sensing element array substrate 50.(P-1). The flexible printed circuit 60 provides electric connections to elements or devices located outside the housing 61.

FIG. 10 shows another embodiment. The embodiment in FIG. 10 also shows the housing 61, the permanent magnet bar 15, the magnetic bias device 14 and the filler 62 in FIG. 3, which are omitted in FIG. 9 to obtain a clear view. Similar to FIG. 6, the elements in the system circuit, such as the VReg 70, the magnetoresistive imaging sensor array 71, . . . , and the amplifier 78, are all arranged on the sensing element array substrate 50.(P-1). No ASIC substrate is provided.

The TCVs 55 are not provided in this embodiment, so all the elements in the system integrated circuit need to be arranged on the top surface 63 of the sensing element array substrate 50.(P-1). The solder bumps 57 are used for electric connections between the flexible printed circuit 60 and the elements located on the sensing element array substrate 50.(P-1). The flexible printed circuit 60 needs to be located above the sensing element array substrate 50.(P-1), and such arrangement may cause the top end of the flexible printed circuit 60 to extend, in the Z-axis direction, out of the induction plane 100. The flexible printed circuit 60 provides electric connections to elements or devices located outside the housing 61.

The invention claimed is:

1. A low profile magnetoresistive imaging sensor array, for reading an image from a medium carrying a magnetic mark, and comprising an electronic subassembly, wherein the electronic subassembly comprises:
at least one sensing element array, and the sensing element array comprising at least one magnetoresistive sensing element;
at least one sensing element array substrate, each sensing element array being located on a top surface of one sensing element array substrate, and each sensing element array substrate further comprising a bottom surface
and having an induction plane, the induction plane passing through the geometric center of the sensing element array and being parallel to the top surface of the sensing element array substrate; and
a system circuit network, the system circuit network comprising one or more application integrated circuits electronically connected to the sensing element array;
wherein in a direction toward the medium, the electronic subassembly has a maximum extension plane parallel to the induction plane, a maximum extension distance is formed between the induction plane and the maximum extension plane, and by means of the position arrangement and electric connection of the integrated circuit and the sensing element array substrate that reduces the maximum extension distance, the maximum extension distance is made to be less than or equal to 150 μm.

2. The low profile magnetoresistive imaging sensor array according to claim 1, wherein a part of or all the plurality of application integrated circuits are integrated on a top surface and/or a bottom surface of an application-specific integrated circuit (ASIC) substrate.

3. The low profile magnetoresistive imaging sensor array according to claim 2, wherein the ASIC substrate is located below the bottom surface of the sensing element array substrate on which the sensing element array functionally supported by the ASIC substrate is located, and one ASIC substrate supports the sensing element array of any quantity.

4. The low profile magnetoresistive imaging sensor array according to claim 2, wherein
the ASIC substrate and the sensing element array substrate on which the sensor element sub-array functionally supported by the ASIC substrate is located are placed in parallel on a rigid support;
one ASIC substrate supports the sensing element array of any quantity; and
the top surface of the ASIC substrate is lower than the induction plane.

5. The low profile magnetoresistive imaging sensor array according to claim 1, wherein a part of or all the plurality of application integrated circuits are integrated on the top surface and/or bottom surface of the sensor element array substrate.

6. The low profile magnetoresistive imaging sensor array according to claim 1, wherein the system circuit network comprises through chip vias and/or solder bumps, and the through chip vias and/or solder bumps provide a part of or all the longitudinal electric connections to the system circuit network.

7. The low profile magnetoresistive imaging sensor array according to claim 6, wherein the longitudinal electric connections provided by the through chip vias comprise the longitudinal electric connection from the top surface of the sensing element array substrate to the bottom surface of the sensing element array substrate and/or from the top surface of the ASIC substrate to the bottom surface of the ASIC substrate and/or the longitudinal electric connection from the sensing element substrate to the ASIC substrate.

8. The low profile magnetoresistive imaging sensor array according to claim 1, comprising a power source and a signal output/input device, wherein the power source and the signal output/input device are electrically connected to the system circuit network.

9. The low profile magnetoresistive imaging sensor array according to claim 8, comprising a flexible printed circuit and/or a printed circuit board (PCB), wherein the flexible printed circuit and/or the PCB provides a part of or all the required electric connections to the system circuit network; and the power source and the signal output/input device are formed on the flexible printed circuit and/or the PCB.

10. The low profile magnetoresistive imaging sensor array according to claim 1, wherein the electronic subassembly has a housing externally, the housing has a housing top surface and a housing bottom surface, and the maximum distance between the housing bottom surface and the induction plane is less than or equal to 150 μm.

11. The low profile magnetoresistive imaging sensor array according to claim 1, comprising a permanent magnet located below the sensing element array substrate and a magnetic bias device located between the permanent magnet and the sensing element array substrate.

12. The low profile magnetoresistive imaging sensor array according to claim 1, wherein the magnetoresistive sensing element is a tunnel magnetoresistance (TMR), an anisotropic magnetoresistance (AMR), a giant magnetoresistance (GM) and/or a Hall sensing element.

13. The low profile magnetoresistive imaging sensor array according to claim 1, wherein the application integrated circuit comprises one or more of a power circuit, a power selection switch, an element selection circuit, a differential amplification circuit, an analog-to-digital converter (ADC) circuit, a rapid memory circuit, an image memory circuit, a long-term memory circuit, an MCU circuit and an input/output circuit, a data analyzer and a data signal converter.

14. The low profile magnetoresistive imaging sensor array according to claim 1, comprising a filler, wherein the filler forms a protective layer on the electronic subassembly, and the protective layer is or is not spaced from the electronic subassembly.

15. The low profile magnetoresistive imaging sensor array according to claim 10, comprising a filler filled in a gap between the housing and the electronic subassembly and covered on the electronic subassembly.

\* \* \* \* \*